(12) United States Patent
Yoshioka

(10) Patent No.: US 9,874,895 B2
(45) Date of Patent: Jan. 23, 2018

(54) REFERENCE CURRENT GENERATING CIRCUITRY, A/D CONVERTER, AND WIRELESS COMMUNICATION DEVICE

(71) Applicant: KABUSHIKI KAISHA TOSHIBA, Minato-ku, Tokyo (JP)

(72) Inventor: Kentaro Yoshioka, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/388,090

(22) Filed: Dec. 22, 2016

(65) Prior Publication Data

US 2017/0242451 A1   Aug. 24, 2017

(30) Foreign Application Priority Data

Feb. 19, 2016 (JP) .................. 2016-030203

(51) Int. Cl.
| | |
|---|---|
| H03M 1/12 | (2006.01) |
| G05F 3/26 | (2006.01) |
| H03K 5/151 | (2006.01) |
| H03K 3/011 | (2006.01) |
| H03L 7/08 | (2006.01) |
| H03K 5/00 | (2006.01) |

(52) U.S. Cl.
CPC .............. *G05F 3/262* (2013.01); *H03K 3/011* (2013.01); *H03K 5/151* (2013.01); *H03L 7/08* (2013.01); *H03M 1/12* (2013.01); *H03K 2005/00019* (2013.01)

(58) Field of Classification Search
CPC .......... G05F 3/262; H02M 7/04; H02M 7/537

USPC .................. 341/110, 144, 137, 155, 122
See application file for complete search history.

(56) References Cited

U.S. PATENT DOCUMENTS

| | | | |
|---|---|---|---|
| 5,247,241 A | 9/1993 | Ueda | |
| 5,990,714 A * | 11/1999 | Takahashi | G06F 1/10 327/149 |
| 7,626,527 B1 * | 12/2009 | Wang | H03M 3/366 341/143 |
| 8,044,654 B2 | 10/2011 | Kapusta, Jr. | |
| 8,717,089 B1 | 5/2014 | Zhu et al. | |
| 8,786,483 B1 | 7/2014 | Thompson et al. | |
| 2004/0046684 A1 * | 3/2004 | Cusinato | H03M 1/002 341/161 |
| 2009/0256733 A1 * | 10/2009 | Kim | H03M 1/002 341/136 |

OTHER PUBLICATIONS

Andersen et al.: "A Cost-Efficient High-Speed 12-bit Pipeline ADC in 0.18-μm Digital CMOS", IEEE Journal of Solid-State Circuits, vol. 40, No. 7, Jul. 2005, pp. 1506-1513.
(Continued)

*Primary Examiner* — Peguy Jean Pierre
(74) *Attorney, Agent, or Firm* — Foley & Lardner LLP

(57) ABSTRACT

A reference current generating circuit has a variable current supply to output a reference current, delay circuitry to generate a reference clock by delaying a clock by a reference delay amount and a delay clock by delaying the clock depending on a current value of the reference current, a phase comparator to compare a phase of the reference clock with a phase of the delay clock to output a comparison result, and control circuitry to control the current value of the reference current based on the compared result.

17 Claims, 14 Drawing Sheets

(56) References Cited

OTHER PUBLICATIONS

Lee et al.: "A 2.5 V CMOS Delay-Locked Loop for an 18 Mbit, 500 Megabyte/s DRAM", IEEE Journal of Solid-State Circuits, vol. 29, No. 12, Dec. 1994, pp. 1491-1496.

* cited by examiner

US 9,874,895 B2

REFERENCE CURRENT GENERATING CIRCUITRY, A/D CONVERTER, AND WIRELESS COMMUNICATION DEVICE

CROSS REFERENCE TO RELATED APPLICATIONS

This application is based upon and claims the benefit of priority from the prior Japanese Patent Application No. 2016-30203, filed on Feb. 19, 2016, the entire contents of which are incorporated herein by reference.

FIELD

Embodiments of the present disclosure relate to a reference current generating circuitry, an A/D converter, and a wireless communication device.

BACKGROUND

It is desired that reference current of analog circuitry is generated without causing variation in its current value. However, in a conventional reference current generating circuitry, the current value of the reference current depends on the element values (e.g., resistance value, capacitance value, etc.) of passive elements. On-chip analog circuitry has a problem that the current value of the reference current varies depending on manufacturing variability of the passive elements, which are difficult to manufacture with high accuracy. Further, using off-chip passive elements, which can be manufactured with high accuracy, leads to a problem that the cost of the analog circuitry increases.

DETAILED DESCRIPTION

Figure 1:
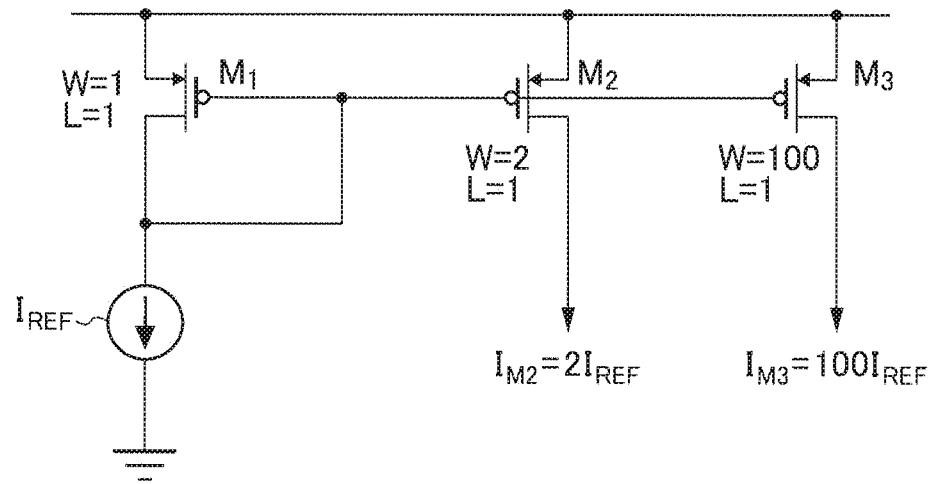
FIG. 1 is a diagram showing an example of a current mirror circuitry.

According to one embodiment, a reference current generating circuit has a variable current supply to output a reference current, delay circuitry to generate a reference clock by delaying a clock by a reference delay amount and a delay clock by delaying the clock depending on a current value of the reference current, a phase comparator to compare a phase of the reference clock with a phase of the delay clock to output a comparison result, and control circuitry to control the current value of the reference current based on the compared result.

Hereinafter, embodiments of the present disclosure will be explained referring to the drawings.

First Embodiment

Reference current generating circuitry according to a first embodiment (hereinafter referred to as "generator circuitry") will be explained referring to FIGS. 1 to 10. In the following description, the circuitry indicates one circuit or a plurality of circuits, the circuit being embedded within a semiconductor chip or configured by circuit elements implemented on a substrate. The circuitry may include a processor or a controller operated in accordance with a program. The generator circuitry according to the present embodiment generates a reference current used by analog circuitry.

First, explanation will be given on the reference current. The reference current is the original current of a current used in each circuit block of the analog circuitry. Generally, the reference current generated by the generator circuitry is copied and amplified by a current mirror circuitry, and then supplied to each circuit block of the analog circuitry.

FIG. 1 is a diagram showing an example of the current mirror circuitry. The current mirror circuitry of FIG. 1 has transistors $M_1$ to $M_3$.

The transistor $M_1$ is a P-type MOSFET (Metal Oxide Semiconductor Field Effect Transistor) (hereinafter referred to as "PMOS") having a source terminal connected to a power-supply line, a drain terminal connected to the generator circuitry, and a gate terminal connected to gate terminals of the transistors $M_2$ and $M_3$. A drain current $I_{DM1}$ of the transistor $M_1$ is a reference current $I_{REF}$ supplied from the generator circuitry. Further, the gate terminal and drain terminal of the transistor $M_1$ are connected to each other.

Each of the transistors $M_2$ and $M_3$ is a PMOS having a source terminal connected to the power-supply line and a gate terminal connected to the gate terminal of the transistor $M_1$. Each of the transistors $M_2$ and $M_3$ has a drain terminal connected to a circuit block corresponding to analog circuitry. These circuit blocks are supplied with drain currents $I_{DM2}$ and $I_{DM3}$ of the transistors $M_2$ and $M_3$, respectively.

Generally, when the MOSFET operates in a saturation region, the drain current $I_D$ can be expressed by the following formula.

$$I_D = \frac{W}{2L} u C_{ox} (V_{GS} - V_{th})^2 \quad (1)$$

In Formula (1), W represents a channel width, L represents a channel length of the MOS, u represents a mobility of carriers, $C_{ox}$ represents a capacitance value of a gate oxide film per a unit area, $V_{GS}$ represents a gate-source voltage, and $V_{th}$ represents a threshold voltage. In Formula (1), channel-length modulation effect is ignored for simplification.

In the current mirror circuitry of FIG. 1, the transistor $M_1$ is diode-connected, and thus operates in a saturation region. Therefore, a gate-source voltage $V_{GS1}$ of the transistor $M_1$ has a value satisfying that $I_{DM1} = I_{REF}$. Further, gate-source voltages $V_{GS2}$ and $V_{GS3}$ of the transistors $M_2$ and $M_3$ are equal to the gate-source voltage $V_{GS1}$ of the transistor $M_1$. Consequently, the drain currents $I_{DM2}$ and $I_{DM3}$ of the transistors $M_2$ and $M_3$ can be expressed by the following formulas.

$$I_{DM2} = \frac{\frac{W_{M2}}{L_{M2}}}{\frac{W_{M1}}{L_{M1}}} \times I_{REF} \quad (2)$$

$$I_{DM3} = \frac{\frac{W_{M3}}{L_{M3}}}{\frac{W_{M1}}{L_{M1}}} \times I_{REF} \quad (3)$$

As will be understood from Formulas (2) and (3), the drain currents $I_{DM2}$ and $I_{DM3}$ are determined by the device size ratios of the transistors $M_2$ and $M_3$ to the transistor $M_1$. Here, it is defined that the transistor $M_1$ has a channel width $W_{M1}$ of 1 and a channel length $L_{M1}$ of 1, the transistor $M_2$ has a channel width $W_{M2}$ of 1 and a channel length $L_{M2}$ of 2, and the transistor $M_3$ has a channel width $W_{M3}$ of 1 and a channel length $L_{M3}$ of 100.

At this time, based on Formulas (2) and (3), $I_{DM2} = 2 I_{REF}$s and $I_{DM3} = 100 I_{REF}$s. That is, the circuit block connected to the drain terminal of the transistor $M_2$ is supplied with a current twice as large as the reference current $I_{REF}$, and the circuit block connected to the drain terminal of the transistor $M_3$ is supplied with a current 100 times as large as the reference current $I_{REF}$.

In this way, in the analog circuitry, the reference current $I_{REF}$ copied and amplified by the current mirror circuitry is supplied to each circuit block. When the current value of the reference current $I_{REF}$ varies, the current value to be supplied to each circuit block deviates from a design value, which leads to a demand for generator circuitry capable of generating high-accuracy reference current $I_{REF}$ with restrained variation.

Conventional generator circuitry generates the reference voltage $I_{REF}$ by applying a voltage V of reference voltage generator circuitry (such as a band-gap reference circuitry) to a resistance R. This reference voltage $I_{REF}$ can be expressed by the following formula, based on Ohm's law.

$$I_{REF} = \frac{V_{REF}}{R} \quad (4)$$

As mentioned above, it is difficult to manufacture the resistance R on a chip with high accuracy, which leads to a case where the resistance value of the resistance R varies from the design value by 20% or more. Accordingly, in the conventional generator circuitry, the reference current $I_{REF}$ sometimes varies greatly depending on the variation in the resistance value.

When the reference current $I_{REF}$ varies greatly as stated above, the design is required to increase the margin of the analog circuitry, which leads to the increase in the power consumption of the analog circuitry.

Further, when using an operational amplifier in discrete time signal processing circuitry (hereinafter referred to as "processing circuitry"), settling time required for the operational amplifier (i.e., time required to drive a load) is in inverse proportion to the operating frequency of the processing circuitry. That is, when the operating frequency is high, the operational amplifier is required to operate at high speed (with short settling time), and when the operating frequency is low, the operational amplifier may operate at low speed (with long settling time). Therefore, supplying a driving current proportional to the operating frequency to the operational amplifier makes it possible to reduce the power consumption of the operational amplifier without deteriorating the operating accuracy of the processing circuitry.

For example, when the processing circuitry is an A/D converter (ADC: Analog to Digital Converter), supplying a driving current proportional to a sampling frequency to the operational amplifier makes it possible to reduce the power consumption of the operational amplifier without deteriorating the AD conversion accuracy of the ADC.

However, the reference current $I_{REF}$ in the above conventional case has a constant current value which does not depend on the operating frequency of the processing circuitry, by which large reference current $I_{REF}$ intended for high-speed operation is always supplied to the operational amplifier of the processing circuitry. As a result, when the operating frequency of the processing circuitry is low, overhead of the power consumption of the operational amplifier becomes large.

As explained above, the conventional generator circuitry has a problem that the current value of the reference current $I_{REF}$ varies depending on the variation in the value of a passive element. Further, the fact that the current value of the reference current $I_{REF}$ is constant leads to a problem that overhead occurs in power consumption when using the reference current $I_{REF}$ in processing circuitry such as an ADC.

Figure 2:
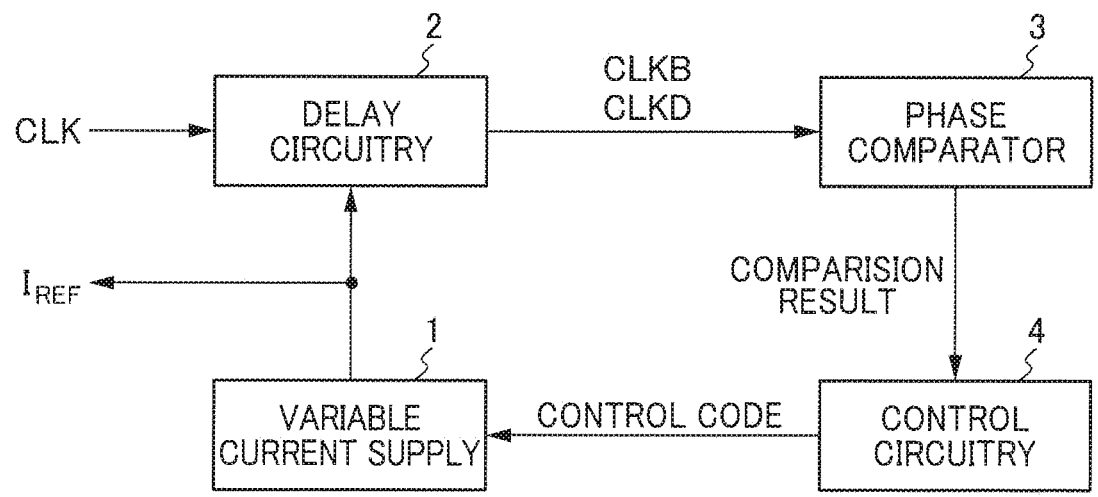
FIG. 2 is a diagram showing a functional configuration of the reference current generating circuitry according to a first embodiment.

Next, the configuration of the generator circuitry according to the present embodiment will be explained. FIG. 2 is a diagram showing a functional configuration of the generator circuitry according to the present embodiment. The generator circuitry of FIG. 2 has a variable current supply 1, delay circuitry 2, a phase comparator 3, and control circuitry 4.

The variable current supply 1 outputs the reference current $I_{REF}$. The reference current $I_{REF}$ outputted by the variable current supply 1 is supplied to the delay circuitry 2 and external analog circuitry. The current value of the reference current $I_{REF}$ is controlled by the control circuitry 4. An arbitrary known variable current supply can be used as the variable current supply 1.

Figure 3:
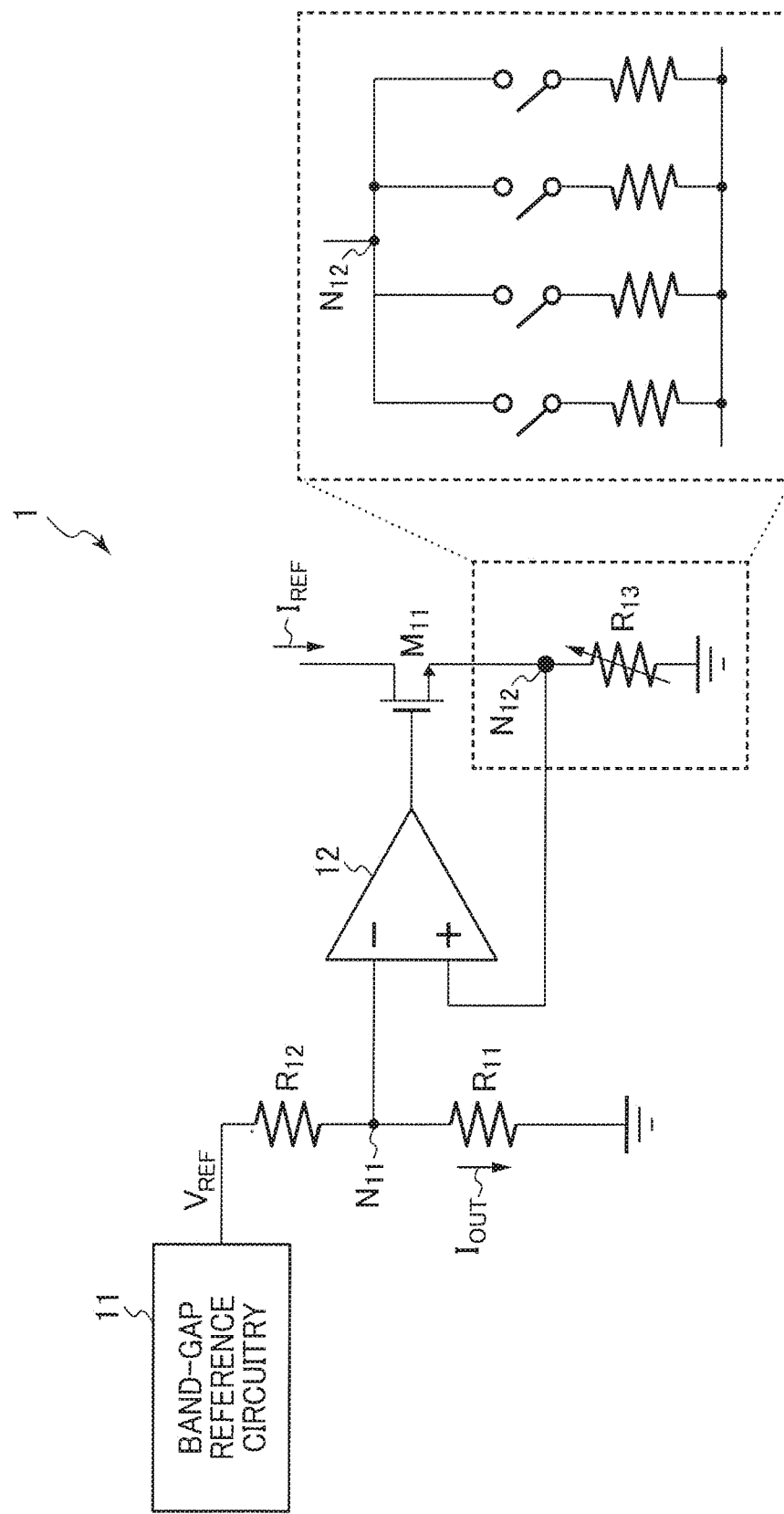
FIG. 3 is a diagram showing an example of a variable current supply of FIG. 2.

FIG. 3 is a diagram showing an example of the variable current supply 1. The variable current supply 1 of FIG. 3 has resistances $R_{11}$ and $R_{12}$, band-gap reference circuitry 11, an operational amplifier 12, a variable resistance $R_{13}$, and a transistor $M_{11}$.

The resistance $R_{11}$ has a first terminal connected to a ground line and a second terminal connected to a node $N_{11}$. The resistance $R_{12}$ has a first terminal connected to the node $N_{11}$ and a second terminal connected to the output terminal of the band-gap reference circuitry 11.

The band-gap reference circuitry 11 has an output terminal connected to the second terminal of the resistance $R_{12}$ and applies a predetermined reference voltage $V_{REF}$ to the second terminal of the resistance $R_{12}$.

The operational amplifier 12 has an inverting input terminal connected to the node $N_{11}$, a non-inverting input terminal connected to a node $N_{12}$, and an output terminal connected to the gate terminal of the transistor $M_{11}$.

The variable resistance $R_{13}$ has a first terminal connected to the ground line and a second terminal connected to the node $N_{12}$. As shown in FIG. 3, the variable resistance $R_{13}$ is formed using, e.g., switches and resistances connected in parallel. Each resistance has a first terminal connected to the ground line and a second terminal connected to the first terminal of each switch. Each switch has a first terminal connected to the second terminal of each resistance and a second terminal connected to the node $N_{12}$.

The resistance value of the variable resistance $R_{13}$ is controlled by the control circuitry 4. The control circuitry 4 controls the resistance value of the variable resistance $R_{13}$ by controlling opening and closing of the switch of the variable resistance $R_{13}$ by control codes.

The transistor $M_{11}$ is an N-type MOSFET (hereinafter referred to as "NMOS") having a source terminal connected to the node $N_{12}$ and a gate terminal connected to the output terminal of the operational amplifier 12. Further, the transistor $M_{11}$ has a drain terminal connected to the input terminal of the delay circuitry 2 and the input terminal of the external analog circuitry. Drain current of the transistor $M_{11}$ is supplied to the delay circuitry 2 and analog circuitry as the reference current $I_{REF}$.

When defining that the resistances $R_{11}$ and $R_{12}$ have resistance values of $R_{11}$ and $R_{12}$ respectively, current $I_{OUT}$ flowing through the resistances $R_{11}$ and $R_{12}$ can be expressed by the following formula.

$$I_{OUT} = \frac{V_{REF}}{R_{11} + R_{12}} \quad (5)$$

The current value of the reference current $I_{REF}$ is determined by the above current value $I_{OUT}$ and the resistance value of the variable resistance $R_{13}$. When the variable current supply 1 of FIG. 3 is manufactured on a chip, variation in the resistance values $R_{11}$ and $R_{12}$ occurs due to manufacturing variability, as mentioned above. Further, even when the resistances $R_{11}$ and $R_{12}$ can be manufactured with high accuracy, the resistance values $R_{11}$ and $R_{12}$ change depending on temperature.

Figure 4:
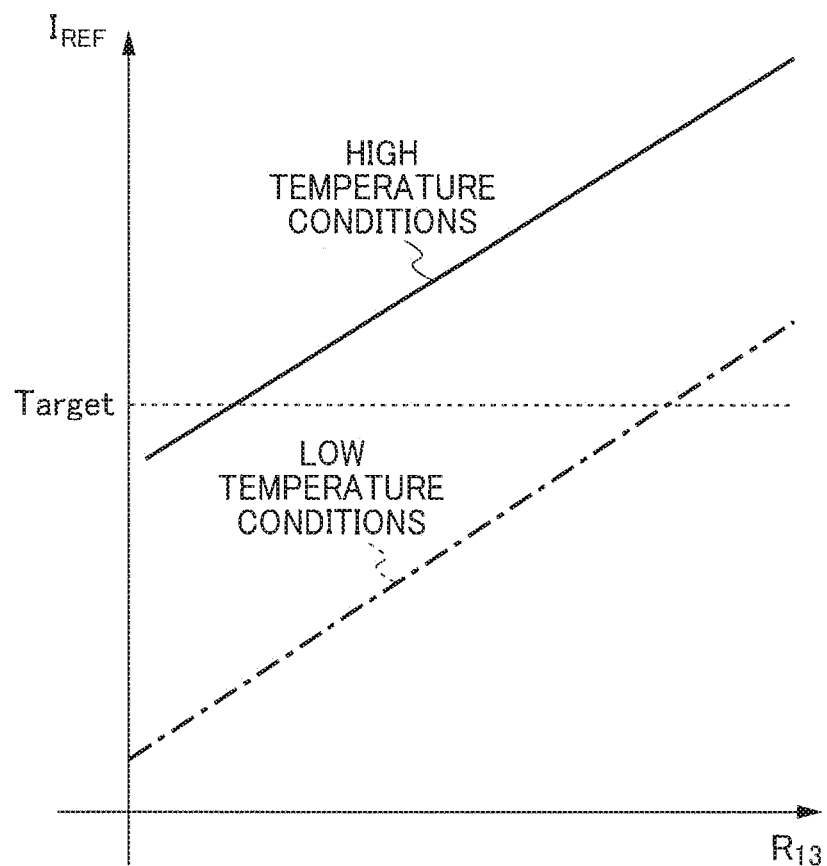
FIG. 4 is a graph showing temperature dependence of the variable current supply of FIG. 3.

FIG. 4 is a graph showing temperature dependence of the variable current supply 1 of FIG. 3. In FIG. 4, the vertical axis represents the current value of the reference current $I_{REF}$ and the horizontal axis represents the resistance value of the resistance $R_{13}$. As shown in FIG. 4, even when the resistance value of the resistance $R_{13}$ is set to a predetermined value by a control code, the current value of the reference current $I_{REF}$ differs depending on temperature conditions of the resistances $R_{11}$ and $R_{12}$. Concretely, the current value under high temperature conditions is larger than the current value under low temperature conditions.

As stated above, the current value of the reference current $I_{REF}$ outputted by the variable current supply 1 differs depending on the manufacturing variability in the resistances $R_{11}$ and $R_{12}$ and temperature conditions. This similarly applies to the above conventional generator circuitry.

In the present embodiment, such a current value of the reference current $I_{REF}$ is calibrated by the delay circuitry 2, phase comparator 3, and control circuitry 4. Accordingly, the current value of the reference current $I_{REF}$ is set to a predetermined current value (Target in FIG. 4). How to calibrate the current value will be mentioned in detail later.

The delay circuitry 2 is inputted with a clock CLK. The clock CLK is, e.g., an operation clock (such as a sampling clock of an ADC) defining the operation timing of the processing circuitry or a clock obtained by multiplying or dividing the operation clock, but the clock CLK should not be limited thereto. The operation clock can be multiplied and divided by a phase-locked loop (PLL). Concretely, the operation clock is inputted into the phase-locked loop, and the operation clock after multiplied or divided by the phase-locked loop is inputted into the delay circuitry 2 as the clock CLK. The delay circuitry 2 generates a reference clock CLKB and a delay clock CLKD from the clock CLK, and inputs them into the phase comparator 3.

The reference clock CLKB is a clock obtained by delaying the clock CLK by a reference delay amount $T_D$. The reference delay amount $T_D$ is determined based on a desired current value $I_{IM}$ of the reference current $I_{REF}$ depending on the frequency of the clock CLK. The reference delay amount, which is set depending on the cycle of the clock CLK, is a half cycle or one cycle of the clock CLK for example, but should not be limited thereto. The delay clock CLKD is a clock obtained by delaying the clock CLK depending on the current value of the reference current $I_{REF}$.

The generator circuitry according to the present embodiment controls the current value of the reference current $I_{REF}$ to make it reach the desired current value $I_N$ by controlling the current value of the reference current $I_{REF}$ so that the delay amount of the delay clock CLKD becomes equal to the reference delay amount $T_D$.

Figure 5:
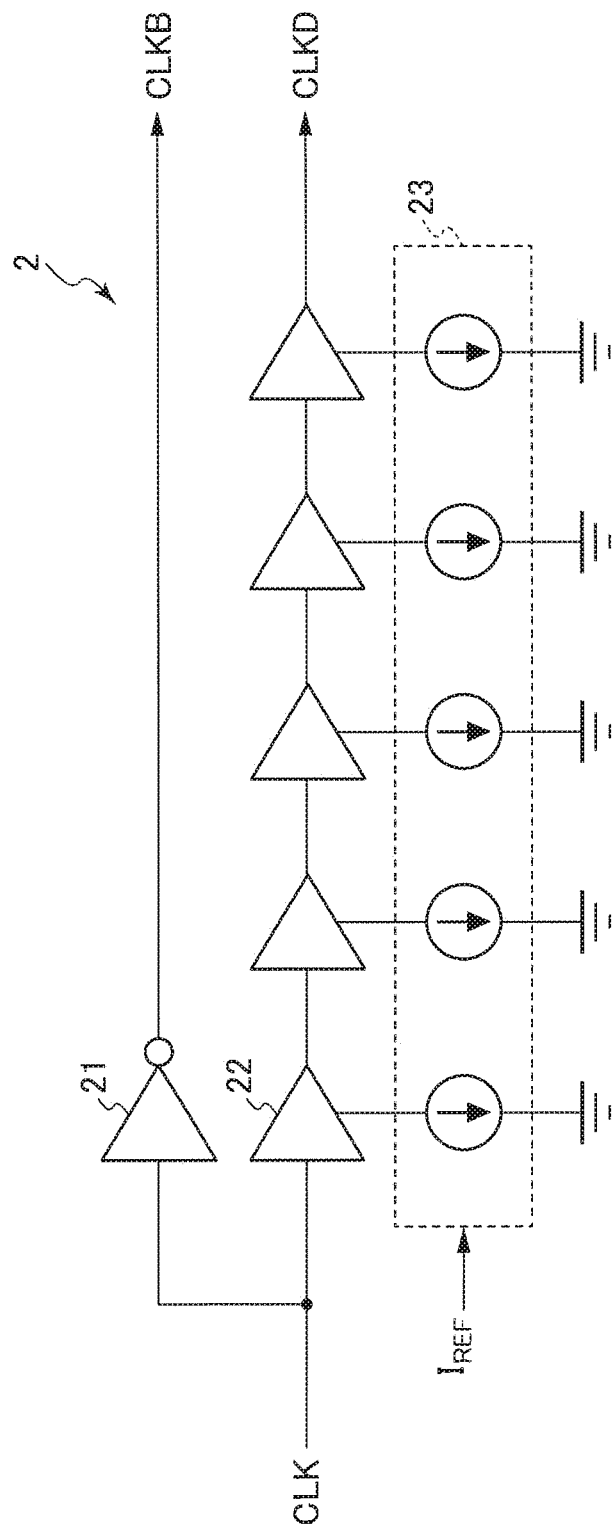
FIG. 5 is a diagram showing an example of delay circuitry of FIG. 2.

FIG. 5 is a diagram showing an example of the delay circuitry 2. The delay circuitry 2 of FIG. 5 has an inverter 21, five delay units 22, and current mirror circuitry 23.

The inverter 21 is inputted with the clock CLK, inverts the inputted clock CLK, and outputs it. The clock outputted by the inverter 21 serves as the reference clock CLKB. In the example of FIG. 5, the reference delay amount $T_D$ of the reference clock CLKB is a half cycle of the clock CLK. When the reference delay amount $T_D$ is one cycle of the clock CLK, the delay circuitry 2 outputs the inputted clock CLK directly as the reference clock CLKB.

The delay unit 22 is inputted with the clock CLK, delays the inputted clock CLK by the delay amount $t_D$, and outputs it. The delay amount $t_D$ for the delay unit 22 is determined depending on the current value of driving current for driving the delay unit 22. The delay amount $t_D$ becomes smaller as the driving current becomes larger, and becomes larger as the driving current becomes smaller.

In the example of FIG. 5, the five delay units 22 connected in series correspond to a delay locked loop (DLL). The clock outputted by this delay locked loop serves as the delay clock CLKD. When each delay unit 22 has the same delay amount $t_D$, the delay amount of the delay clock CLKD compared to the clock CLK becomes 5 $t_D$s.

Note that the number of delay units 22 corresponding to the delay locked loop may be arbitrarily set. Further, the clock outputted by the delay unit 22 in the N-th stage (N is an arbitrary number) of the delay locked loop may be outputted to the outside. For example, the clock outputted by the delay unit 22 in the third stage becomes a clock lagging behind the clock CLK by the delay amount $t_D$.

The current mirror circuitry 23 copies the reference current $I_{REF}$ outputted by the variable current supply 1, and supplies it to each delay unit 22 as driving current. The current mirror circuitry 23 may amplify the reference current $I_{REF}$ to supply it to each delay unit 22.

Figure 6:
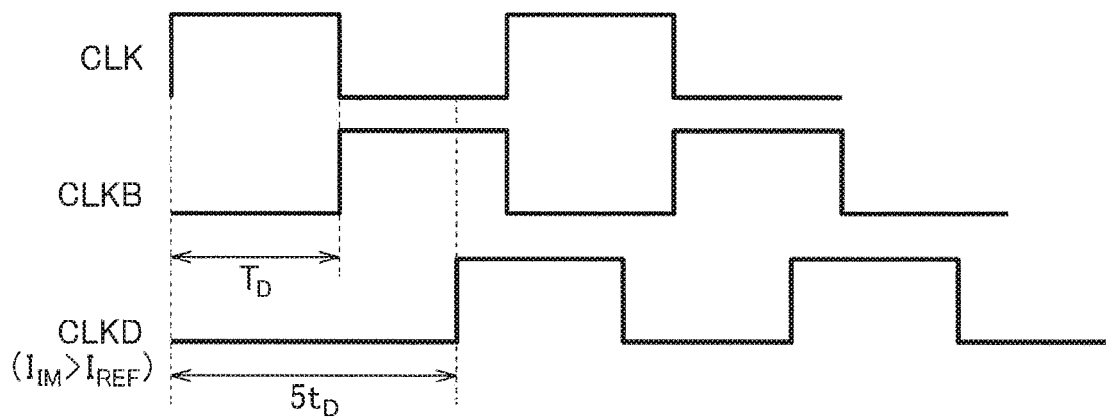
FIG. 6 is a diagram showing an example of a reference clock and a delay clock in the delay circuitry of FIG. 5.

FIG. 6 is a diagram showing an example of the reference clock CLKB and delay clock CLKD in the delay circuitry 2 of FIG. 5. As mentioned above, in the delay circuitry 2 of FIG. 5, the delay amount $T_D$ of the reference clock CLKB is a half cycle of the clock CLK.

As shown in FIG. 6, when the current value of the reference current $I_{REF}$ is smaller than the desired current value $I_{IM}$ dependent on the delay amount $T_D$, delay amount 5 $t_D$s of the delay clock CLKD becomes larger than the delay amount $T_D$. On the other hand, when the current value of the reference current $I_{REF}$ is larger than the desired current value $I_{IM}$ dependent on the delay amount $T_D$, delay amount 5 $t_D$s of the delay clock CLKD becomes smaller than the delay amount $T_D$.

The phase comparator 3 is inputted with the reference clock CLKB and delay clock CLKD, compares the phases of the inputted reference clock CLKB and delay clock CLKD, and outputs a comparison result. The phase comparison is performed by comparing the rising edge of the reference clock CLKB with the rising edge of the delay clock CLKD to see which leads the other, for example.

Figure 7:
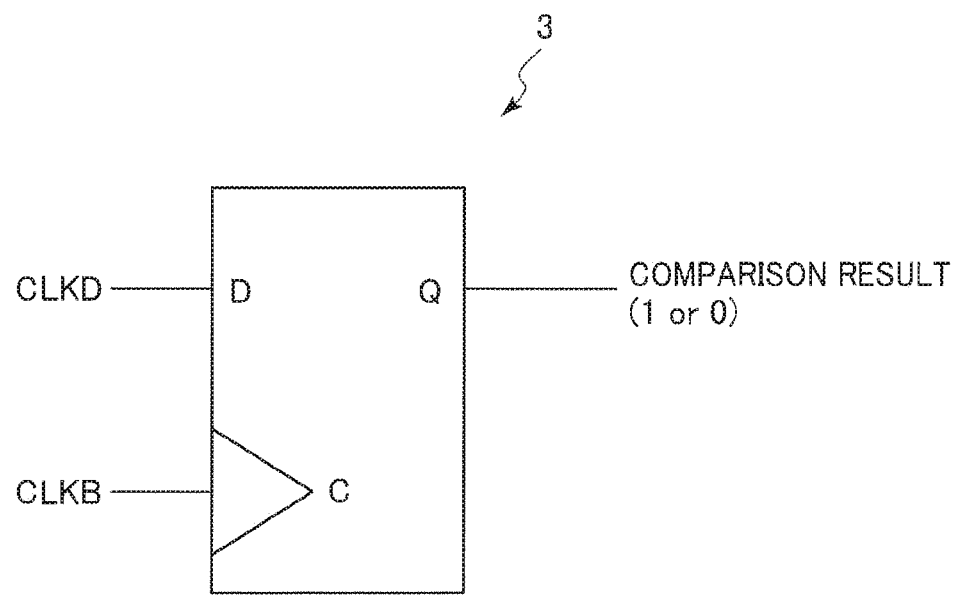
FIG. 7 is a diagram showing an example of a phase comparator of FIG. 2.

FIG. 7 is a diagram showing an example of the phase comparator 3. In the example of FIG. 7, D flip-flop circuitry is used as the phase comparator 3, the D flip-flop circuitry has a D terminal inputted with the delay clock D, a C terminal inputted with the reference clock CLKB, and a Q terminal outputting a comparison result. The comparison result becomes the value of the delay clock CLKD at the rising timing of the reference clock CLKB.

When the rising edge of the delay clock CLKD leads the rising edge of the reference clock CLKB, the phase comparator 3 of FIG. 7 outputs 1 from the Q terminal as the comparison result. This corresponds to a case where the delay amount of the delay clock CLKD is smaller than the reference delay amount $T_D$, i.e., a case where the current value of the reference current $I_{REF}$ is larger than the current value $I_{IM}$.

On the other hand, when the rising edge of the delay clock CLKD lags behind the rising edge of the reference clock CLKB, the phase comparator 3 of FIG. 7 outputs 0 from the Q terminal as the comparison result. This corresponds to a case where the delay amount of the delay clock CLKD is larger than the reference delay amount $T_D$, i.e., a case where the current value of the reference current $I_{REF}$ is smaller than the current value $I_{IM}$.

Note that the phase comparator 3 should not be limited to the example of FIG. 7. For example, a TD (Time to Digital) converter may be used as the phase comparator 3. This makes it possible to obtain high-accuracy time resolution.

The control circuitry 4 is inputted with the comparison result from the phase comparator 3. The control circuitry 4 controls the current value of the reference current $I_{REF}$ to be generated by the variable current supply 1, depending on the inputted comparison result. More specifically, the control circuitry 4 controls the current value of the reference current $I_{REF}$ so that the delay amount of the delay clock CLKB approaches the reference delay amount $T_D$, which is the delay amount of the reference clock CLKD. Accordingly, the current value of the reference current $I_{REF}$ is controlled to approach the desired current value $I_{IM}$ dependent on the frequency of the clock CLK. The control circuitry 4 is configured using a processor, for example.

Figure 8:
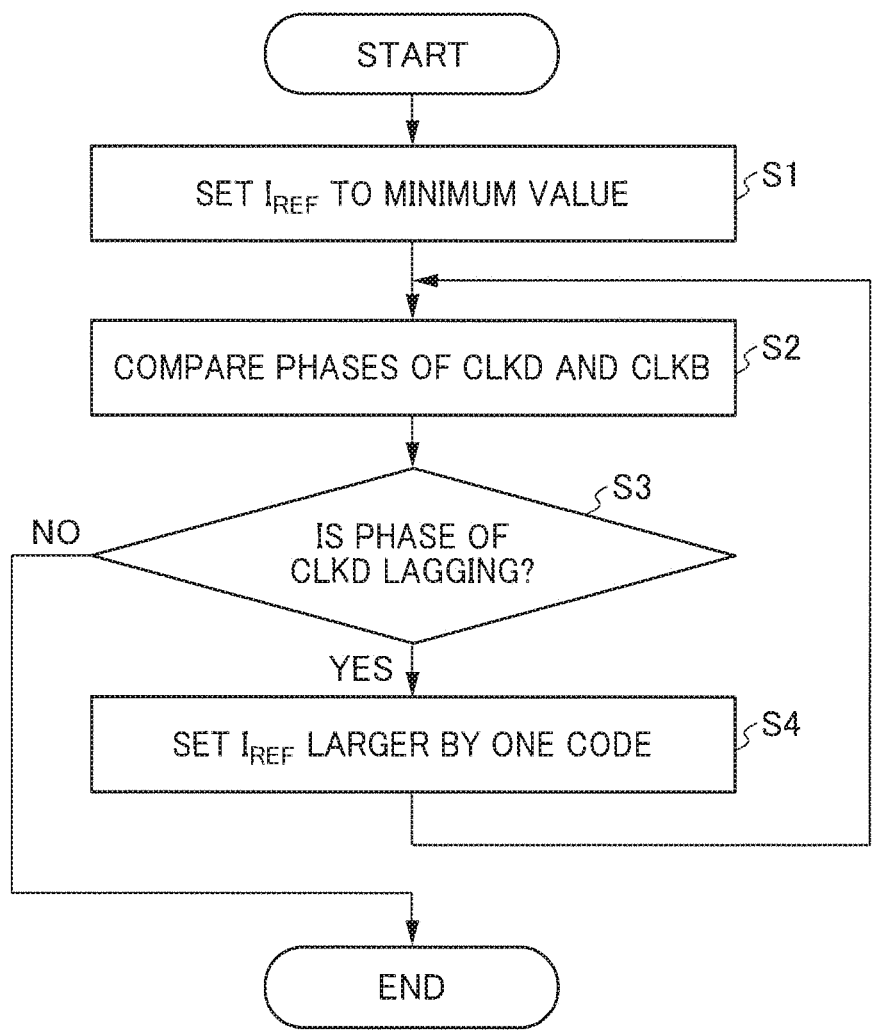
FIG. 8 is a flow chart showing an example of a calibration process for reference current according to the first embodiment.

Next, operation of the generator circuitry according to the present embodiment will be explained. FIG. 8 is a flow chart showing an example of a calibration process performed on the reference current $I_{REF}$ by the generator circuitry. This calibration process is carried out when the generator circuitry starts its operation or when the external analog circuitry starts its operation, for example. Further, the calibration process may be carried out at predetermined time intervals.

As shown in FIG. 8, after the generator circuitry starts the calibration process, the control circuitry 4 sets the current value of the reference current $I_{REF}$ to the minimum value (Step S1). Concretely, the control circuitry 4 inputs a control code corresponding to the minimum value into the variable current supply 1.

The variable current supply 1 for which the current value is set outputs the reference current $I_{REF}$ having the set current value. This reference current $I_{REF}$ is inputted into the delay circuitry 2. The delay circuitry 2 inputted with the reference current $I_{REF}$ outputs the reference clock CLKD and delay clock CLKB. These reference clock CLKD and delay clock CLKB are inputted into the phase comparator 3. Then, the phase comparator 3 compares the phases of the reference clock CLKD and delay clock CLKB (Step S2).

At this time, the current value of the reference current $I_{REF}$ is set to the minimum value and thus smaller than the current value $I_{IM}$ ($I_{IM}$>$I_{REF}$). Therefore, the delay amount of the delay clock CLKB is larger than the reference delay amount $T_D$. That is, the phase of the delay clock CLKD lags behind the phase of the reference clock CLKB (YES at Step S3).

As a result, the rising edge of the delay clock CLKD lags behind the rising edge of the reference clock CLKB, and thus the phase comparator 3 outputs 0 as the comparison result. This comparison result is inputted into the control circuitry 4. The control circuitry 4 inputted with the comparison result (0) showing that the phase of the delay clock CLKD lags behind the phase of the reference clock CLKB sets the current value of the reference current $I_{REF}$ larger by one code (Step S4). That is, the control circuitry 4 inputs a control code made larger by one code into the variable current supply 1. Accordingly, the current value of the reference current $I_{REF}$ to be outputted by the variable current supply 1 becomes larger by one code. Note that the variation in the current value of the reference current $I_{REF}$ at Step S4 should not be limited to one code, and may be arbitrarily set.

Hereinafter, the process of Steps S2 to S4 is repeated. The current value of the reference current $I_{REF}$ becomes larger with each cycle, and the delay amount of the delay clock CLKB becomes smaller than the reference delay amount $T_D$ in due course. That is, the phase of the delay clock CLKD leads the phase of the reference clock CLKB (NO at Step S3).

As a result, the rising edge of the delay clock CLKD leads the rising edge of the reference clock CLKB, and thus the phase comparator 3 outputs 1 as the comparison result. This comparison result is inputted into the control circuitry 4. The control circuitry 4 inputted with the comparison result (1) showing that the phase of the delay clock CLKD leads the phase of the reference clock CLKB terminates calibrating the current value of the reference current $I_{REF}$. With the above process, the generator circuitry can make the current value of the reference current $I_{REF}$ close to the current value $I_{IM}$.

As explained above, the generator circuitry according to the present embodiment can calibrate the current value of the reference current $I_{REF}$ to set it to the desired current value $I_{IM}$, based on the frequency of the clock CLK. Therefore, as shown in FIG. 4, even when the current value of the variable current supply 1 varies depending on the manufacturing variability in the resistance and temperature characteristics, the generator circuitry can generate the reference current $I_{REF}$ with high accuracy while restraining the influence of this variation. That is, the present embodiment can realize generator circuitry capable of generating high-accuracy reference current $I_{REF}$.

Further, in the generator circuitry according to the present embodiment, the delay unit 2 is formed using a delay locked loop composed of many digital elements. This makes it possible to reduce the circuitry area of the generator circuitry. Further, the delay unit 2 can be manufactured through a miniaturization process, which leads to the reduction in the production cost of the generator circuitry.

Further, the generator circuitry according to the present embodiment can generate the reference current $I_{REF}$ having a current value proportional to the frequency of the clock CLK. That is, the current value of the reference current $I_{REF}$ becomes larger as the frequency of the clock CLK becomes higher, and becomes smaller as the frequency of the clock CLK becomes lower.

Figure 9:
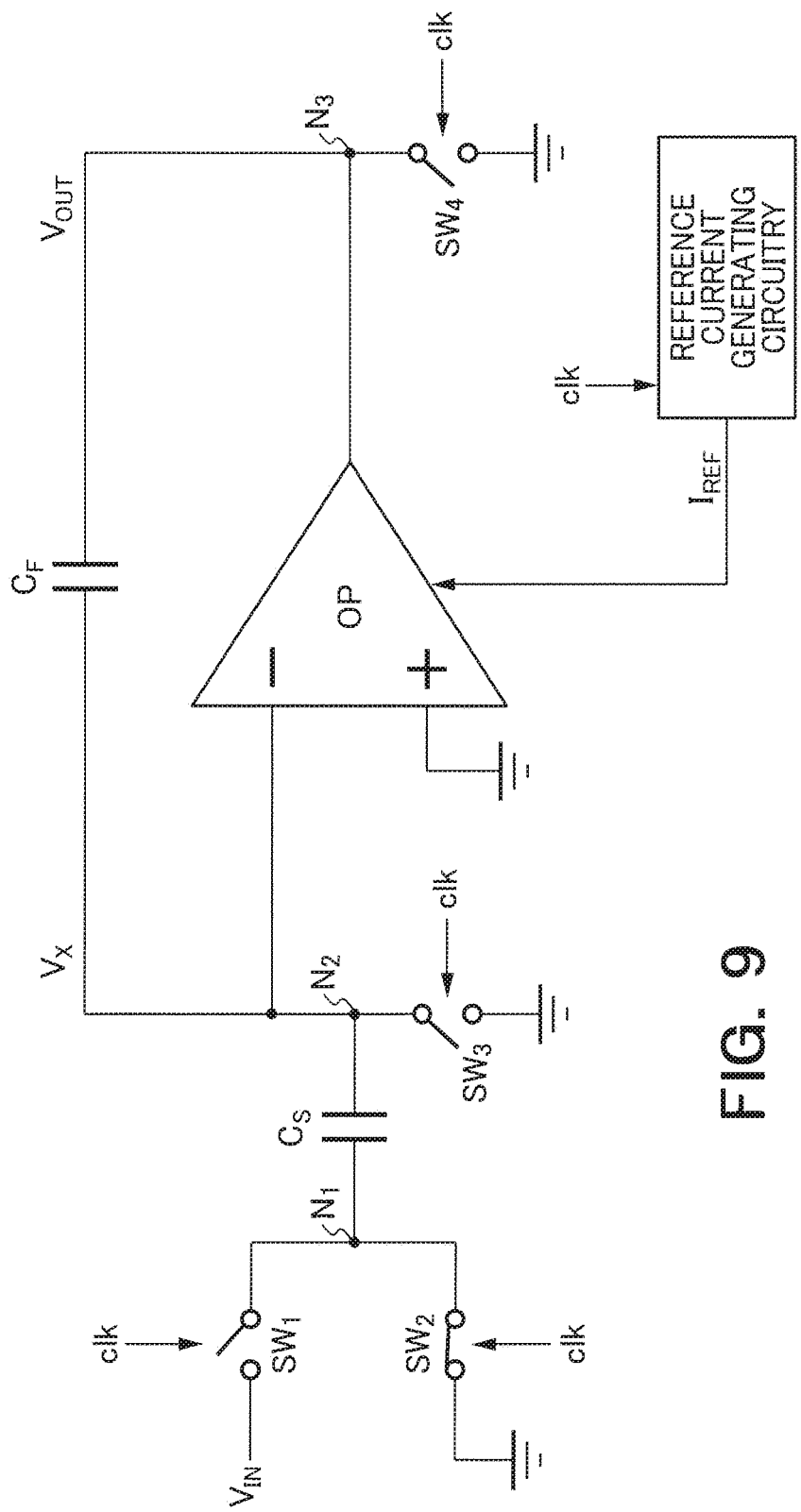
FIG. 9 is a diagram showing an example of discrete-time amplifier circuitry applied with the reference current generating circuitry according to the first embodiment.

Here, suppose a case where the generator circuitry according to the present embodiment is applied to processing circuitry. FIG. 9 is a diagram showing an example of discrete-time amplifier circuitry (hereinafter referred to as "amplifier circuitry") applied with the generator circuitry. The amplifier circuitry of FIG. 9 has switches $SW_1$ to $SW_4$, capacitors $C_S$ and $C_F$, and an operational amplifier OP.

The switch $SW_1$ has a first terminal inputted with an input signal $V_{IN}$ and a second terminal connected to a node $N_1$. The input signal $V_{IN}$ is a voltage signal to be amplified. The switch $SW_2$ has a first terminal connected to a ground line and a second terminal connected to the node $N_1$. The switch $SW_3$ has a first terminal connected to the ground line and a second terminal connected to a node $N_2$. The switch $SW_4$ has a first terminal connected to the ground line and a second terminal connected to a node $N_3$. The voltage of the node $N_3$ becomes an output signal $V_{OUT}$. The output signal $V_{OUT}$ is a voltage signal obtained by amplifying the input signal $V_{IN}$ by a predetermined gain $G_V$. When defining that the capacitor $C_S$ has a capacitance value of $C_S$ and the capacitor $C_F$ has a capacitance value of $C_F$, the gain $G_V$ of the amplifier circuitry can be expressed as $C_S/C_F$.

The capacitor $C_S$ has a first terminal connected to the node $N_1$ and a second terminal connected to the node $N_2$. The capacitor $C_S$ samples the input signal $V_{IN}$. The capacitor $C_F$ has a first terminal connected to the node $N_2$ and a second terminal connected to the node $N_3$.

The operational amplifier OP has an inverting input terminal connected to the node $N_2$, a non-inverting input terminal connected to the ground line, and an output terminal connected to the node $N_3$. Further, the operational amplifier OP is driven by the reference current $I_{REF}$ supplied from the generator circuitry according to the present embodiment.

The amplifier circuitry of FIG. 9 has a sampling phase and an amplification phase as operation phases. In the sampling phase, the amplifier circuitry samples the input signal $V_{IN}$ in the capacitor $C_S$ and resets the capacitor $C_F$. Further, in the amplification phase, the amplifier circuitry amplifies the input signal $V_{IN}$ sampled in the capacitor $C_S$. Concretely, the amplifier circuitry transfers the charges accumulated in the capacitor $C_S$ to the capacitor $C_F$. The voltage of the node $N_3$ after this transference becomes the output signal $V_{OUT}$.

Switching of the operation phases of the amplifier circuitry is controlled by opening and closing the switches $SW_1$ to $SW_4$. Concretely, in the sampling phase, the switches $SW_1$, $SW_3$, and $SW_4$ are turned on and the switch $SW_2$ is turned off. On the other hand, in the amplification phase, the switches $SW_1$, $SW_3$, and $SW_4$ are turned off and the switch $SW_2$ is turned on.

Such opening and closing of the switches $SW_1$ to $SW_4$ are controlled by a clock clk. This clock clk is inputted into the generator circuitry as the clock CLK.

Figure 10:
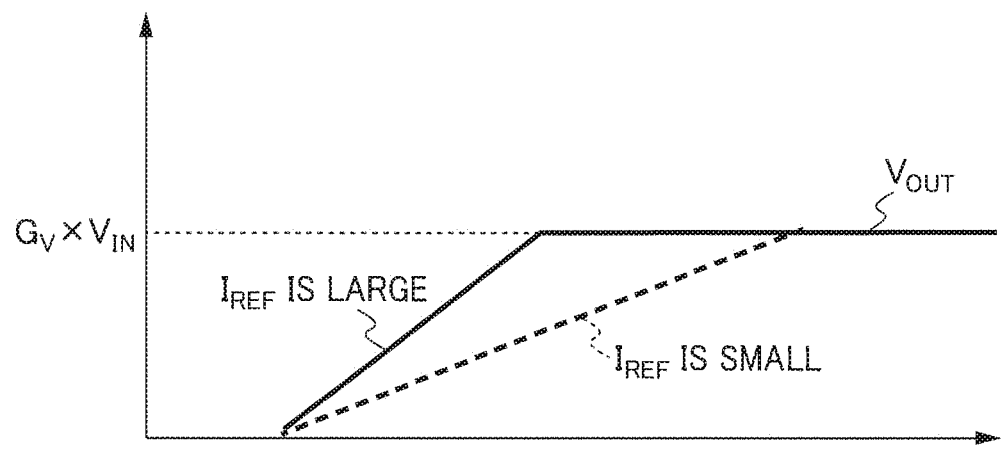
FIG. 10 is a graph showing changes in an output signal dependent on the current value of the reference current.

With such a configuration, the operational amplifier OP is supplied with the reference current $I_{REF}$ proportional to the frequency of the clock clk. FIG. 10 is a graph showing changes in the output signal $V_{OUT}$ dependent on the current value of the reference current $I_{REF}$.

When the frequency of the clock clk is high, large reference current $I_{REF}$ is supplied to the operational amplifier, by which the settling time of the operational amplifier becomes short and the operation speed of the operational amplifier increases, as shown in FIG. 10. As a result, the amplifier circuitry can operate at high speed dependent on the frequency of the clock clk.

When the frequency of the clock clk is low, small reference current $I_{REF}$ is supplied to the operational amplifier, by which the power consumption of the operational amplifier can be reduced. At this time, as shown in FIG. 10, the settling time of the operational amplifier becomes longer and the operation speed of the operational amplifier decreases, but accuracy of the amplifying operation of the amplifier circuitry is not deteriorated since the operation speed of the amplifier circuitry also decreases.

In this way, applying the generator circuitry according to the present embodiment to the processing circuitry makes it possible to reduce the power consumption of the processing circuitry without deteriorating the operating accuracy of the processing circuitry. Note that the processing circuitry should not be limited to the amplifier circuitry, and may be an ADC.

Further, the calibration method should not be limited to the calibration method explained above, in which the control circuitry 4 performs calibration by gradually increasing the current value of the reference current $I_{REF}$ from the minimum value until it becomes larger than the current value $I_{IM}$. For example, the control circuitry 4 may perform the calibration by gradually reducing the current value of the reference current $I_{REF}$ from the maximum value until it becomes smaller than the current value $I_{IM}$. Each calibration method makes it possible for the control circuitry 4 to calibrate the current value of the reference current $I_{REF}$ by a simple control.

Further, as another calibration method, it is also possible that the control circuitry 4 calibrates the reference current $I_{REF}$ by performing successive approximation. This calibration method makes the control by the control circuitry 4 more complicated compared to the above calibration methods, but makes it possible to shorten the time taken to settle the current value of the reference current $I_{REF}$ to the current value $I_{IM}$. That is, the speed of the calibration process can be increased.

Note that in the example explained in the present embodiment, the generator circuitry is formed using MOSFETs. However, the generator circuitry according to the present embodiment may be formed using bipolar transistors. In this case, the NMOS, PMOS, source terminal, drain terminal, and gate terminal in the above explanation should be replaced with NPN-type bipolar transistor, PNP-type bipolar transistor, emitter terminal, collector terminal, and base terminal, respectively. This can be similarly applied to the other embodiments.

Second Embodiment

The generator circuitry according to a second embodiment will be explained referring to FIGS. 11 and 12.

Generally, an ideal current value for the driving current of the operational amplifier is determined depending on the capacitance value of a capacitive load driven by the operational amplifier. However, similarly to the resistance value in the first embodiment, the capacitance value of the capacitive load varies due to manufacturing variability, temperature dependence, etc. It is difficult for the conventional generator circuitry to restrain the influence of such a variation in the capacitance value. Consequently, it is forced to increase the margin of the operational amplifier, which increases the power consumption of the operational amplifier.

In the present embodiment, explanation will be given on generator circuitry capable of restraining the influence of the variation in the capacitance value of the capacitive load. FIG. 11 is a diagram showing an example of the delay unit 22 corresponding to the delay circuitry 2 according to the present embodiment. The delay unit 22 of FIG. 11 has transistors $M_{21}$ and $M_{22}$ and a capacitor C. The other components are similar to those of the first embodiment.

The transistor $M_{21}$ is an NMOS having a source terminal connected to the current mirror circuitry 23, a gate terminal inputted with the clock CLK, and a drain terminal connected to the node $N_2$. The node $N_2$ is connected to the post-stage circuitry. Concretely, the node $N_2$ is connected to the gate terminals of the transistors $M_{21}$ and $M_{22}$ of the delay unit 22 in the next stage or to the input terminal of the phase comparator 3 (e.g., the D terminal of the phase comparator 3 of FIG. 7). Further, in the example of FIG. 11, the current mirror circuitry 23 supplies a current which is K times as large as the reference current $I_{REF}$ to the delay unit 22.

The transistor $M_{22}$ is a PMOS having a source terminal connected to a power-supply line, a gate terminal inputted with the clock CLK, and a drain terminal connected to the node $N_2$. The transistor $M_{22}$ and transistor $M_{21}$ correspond to an inverter.

The capacitor C has a first terminal connected to the node $N_2$ and a second terminal connected to the power-supply line.

Figure 11:
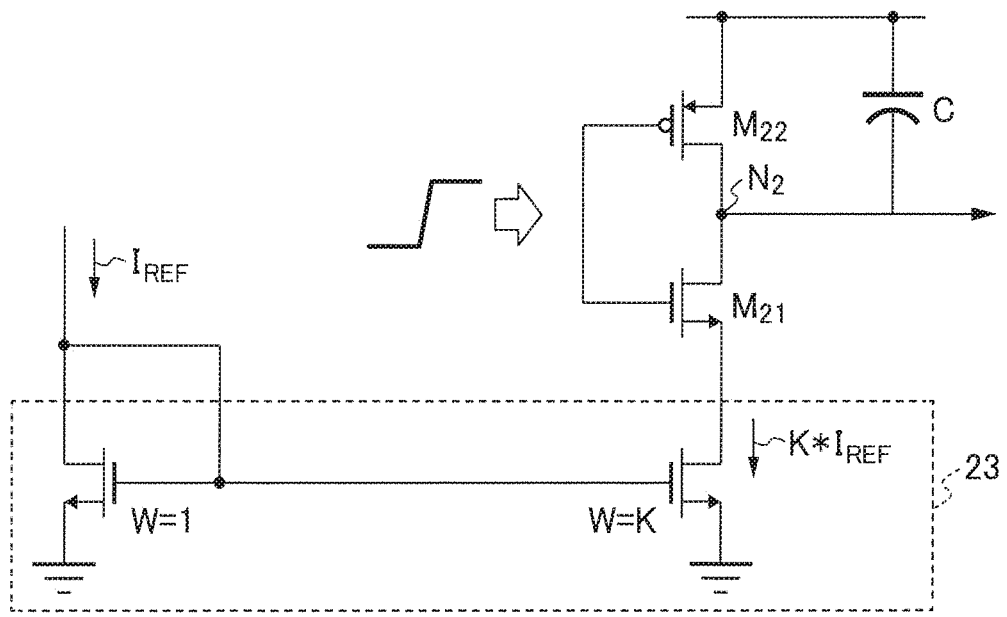
FIG. 11 is a diagram showing an example of delay unit corresponding to the delay circuitry according to a second embodiment.

The delay amount $t_D$ of the delay unit 22 of FIG. 11 corresponds to the change time of the inverter, which is i.e. the time for extracting charge Q stored in the capacitor C. Here, FIG. 12 is a graph showing changes in an output voltage $V_{OUT}$ of the inverter.

Figure 12:
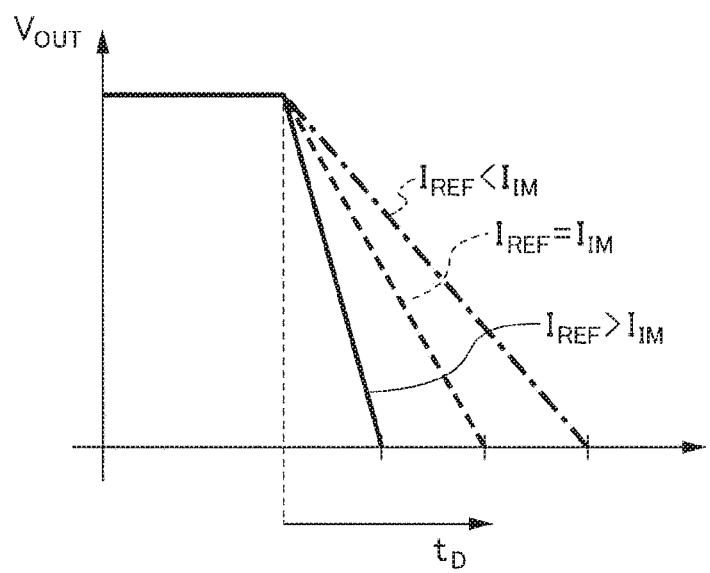
FIG. 12 is a graph showing changes in the output voltage of an inverter.

As shown in FIG. 12, the output voltage $V_{OUT}$ changes faster (the delay amount $t_D$ becomes smaller) as the current value of the reference current $I_{REF}$ becomes larger, and gradually changes (the delay amount $t_D$ becomes larger) as the current value of the reference current $I_{REF}$ becomes smaller. That is, the delay unit 22 of FIG. 11 realizes the operation of the delay units 22 explained in the first embodiment. More specifically, the delay amount $t_D$ of the delay unit 22 of FIG. 11 can be expressed by the following formula.

$$Q = V_{ref} \times C \quad (6)$$

$$t_D = \frac{V_{ref} \times C}{I_{REF}} \quad (7)$$

In Formulas (6) and (7), Q represents the amount of charge stored in the capacitor C when the clock inputted into the delay unit 22 (inverter) is 1, $V_{ref}$ represents the power-supply voltage of the inverter, and C represents the capacitance value of the capacitor C.

As will be understood from Formulas (6) and (7), the delay amount $t_D$ is proportional to the capacitance value of the capacitor C. Therefore, when the capacitance value of the capacitor C varies, the delay amount $t_D$ also varies.

When the capacitor C is not a parasitic capacitance but a capacitor intentionally created (e.g., a capacitor created between wirings), the variation in the capacitance value of the capacitor C is caused following the variation in the capacitance value of the capacitive load driven by the operational amplifier track.

For example, when the capacitance value of the capacitive load of the operational amplifier becomes larger by 20% of the design value, current required for the operational amplifier to drive the capacitive load increases by 20%. At this time, the capacitance value of the capacitor C also becomes larger by 20% of the design value, and the delay amount $t_D$ for the delay unit 22 becomes larger by 20% of the design value.

However, the control circuitry 4 controls the delay amount $t_D$ for the delay unit 22 so that the delay amount $T_D$ becomes equal to the reference delay amount $T_D$. As a result, the delay amount $t_D$ for the delay unit 22 is controlled to be set to the design value, and the current value of the reference current $I_{REF}$ becomes larger by 20% of the design value (current value $I_{IM}$).

As explained above, in the generator circuitry according to the present embodiment, when the capacitance value of the capacitive load driven by the operational amplifier varies, the current value of the reference current $I_{REF}$ also varies following this variation. In the above example, when the capacitance value of the capacitive load becomes larger by 20%, the current value of the reference current $I_{REF}$ also becomes larger by 20%.

As stated above, the generator circuitry according to the present embodiment can generate an appropriate reference current $I_{REF}$ depending on the variation in the capacitance value. Supplying the reference current $I_{REF}$ generated by the generator circuitry according to the present embodiment to the operational amplifier eliminates the need to increase the margin of the operational amplifier depending on the variation in the capacitance value, which leads to the reduction in the power consumption of the operational amplifier.

In the delay unit 22 of FIG. 11, the current mirror circuitry 23 is connected between the source terminal of the transistor $M_{21}$ and the ground line, by which the current value of the reference current $I_{REF}$ when the clock inputted into the delay unit 22 changes from 0 to 1 follows the variation in the capacitance value.

In the delay unit 22 according to the present embodiment, the current mirror circuitry 23 may be connected between the source terminal of the transistor $M_{22}$ and the power-supply line. This makes it possible to make the current value of the reference current $I_{REF}$ when the clock inputted into the delay unit 22 changes from 1 to 0 follow the variation in the capacitance value.

Third Embodiment

Figure 13:
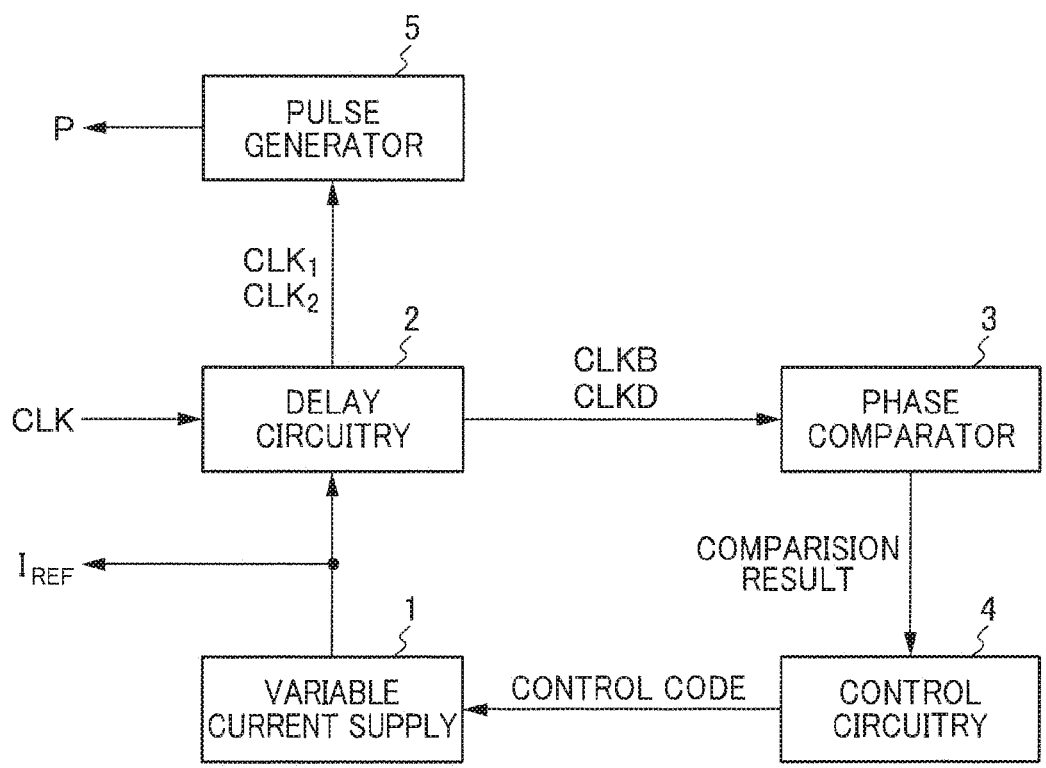
FIG. 13 is a diagram showing a functional configuration of the reference current generating circuitry according to a third embodiment.

The generator circuitry according to a third embodiment will be explained referring to FIGS. 13 to 15. FIG. 13 is a diagram showing a functional configuration of the generator circuitry according to the present embodiment. The generator circuitry of FIG. 13 has a pulse generator 5. The other components are similar to those of the first embodiment.

The pulse generator 5 is inputted with a first delay clock $CLK_1$ and a second delay clock $CLK_2$ from the delay circuitry 2.

As mentioned above, within the delay circuitry 2, a plurality of delay units 22 generate a plurality of clocks by delaying the clock CLK. Further, as in the example of FIG. 5, when the delay circuitry 2 has the inverter 21, the inverter 21 generates a clock by inverting the clock CLK (by delaying the clock CLK by a half cycle).

Each of the first delay clock $CLK_1$ and second delay clock $CLK_2$ is any one of a plurality of clocks generated within the delay circuitry 2 or the clock CLK inputted into the delay circuitry 2. The first delay clock $CLK_1$ has a delay amount different from that of the second delay clock $CLK_2$. The clock having a smaller delay amount is defined as the first delay clock $CLK_1$, and the clock having a larger delay amount is defined as the second delay clock $CLK_2$.

The pulse generator 5 generates and outputs a pulse P having a pulse width equal to the difference between the delay amount of the first delay clock $CLK_1$ and the delay amount of the second delay clock $CLK_2$. The pulse generator 5 can generate the pulse P having an arbitrary pulse width by changing the delay amounts of the first delay clock $CLK_1$ and second delay clock $CLK_2$.

Figure 14:
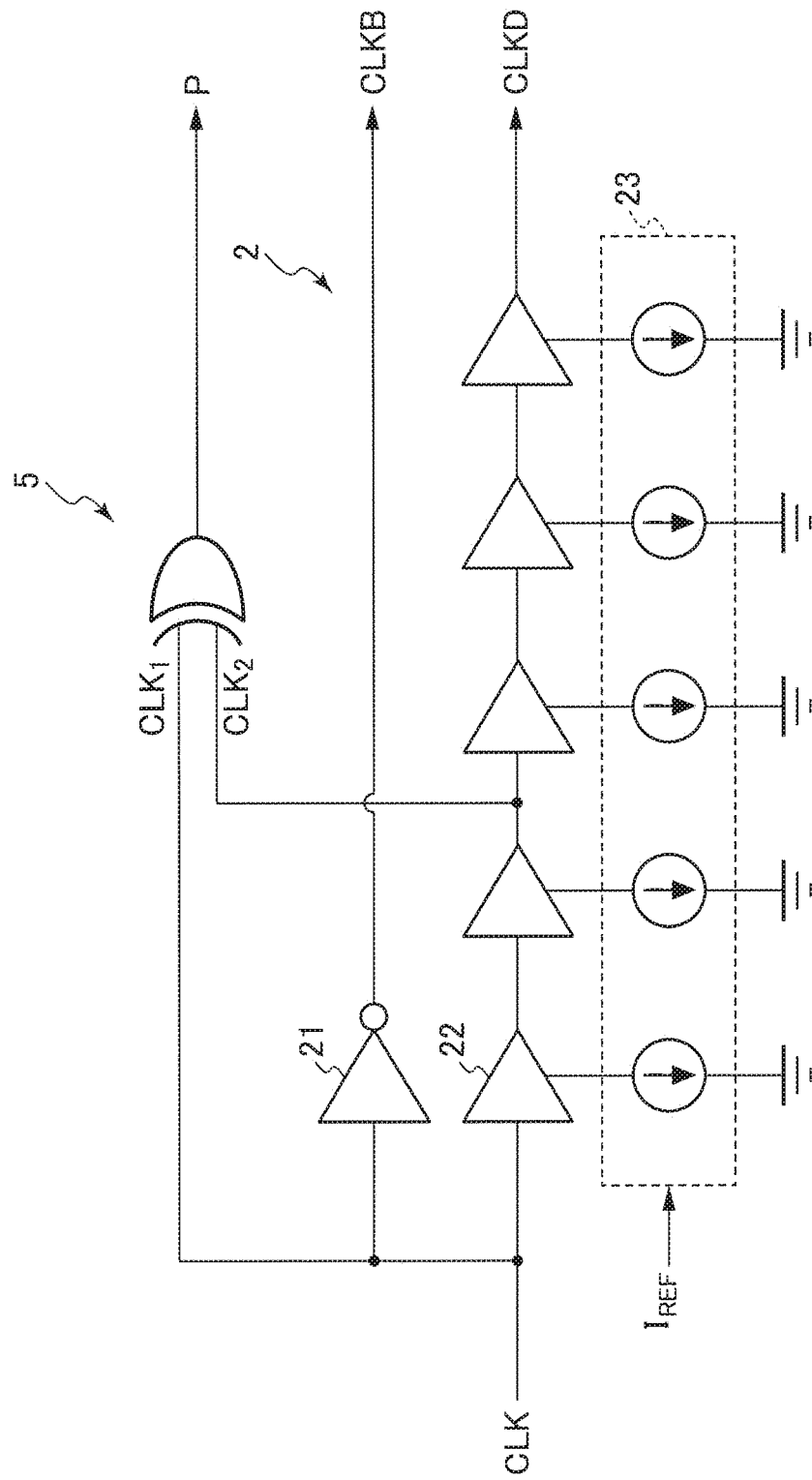
FIG. 14 is a diagram showing an example of a pulse generator of FIG. 13.

FIG. 14 is a diagram showing an example of the pulse generator 5. The pulse generator of FIG. 14 is formed using an EXOR circuitry. In the example of FIG. 14, the EXOR (Exclusive OR) circuitry has a first input terminal connected to the input terminal of the delay circuitry 2 (the input terminal of the delay unit 22 in the first stage). The clock CLK inputted from the first input terminal corresponds to the first delay clock $CLK_1$. Therefore, the delay amount of the first delay clock $CLK_1$ is 0.

Further, the EXOR circuitry has a second input terminal connected to the output terminal of the delay unit 22 in the second stage. The clock outputted by the delay unit 22 in the second stage and inputted into the second input terminal corresponds to the second delay clock $CLK_2$. Therefore, the delay amount of the second delay clock $CLK_2$ is $2 t_D s$.

Figure 15:
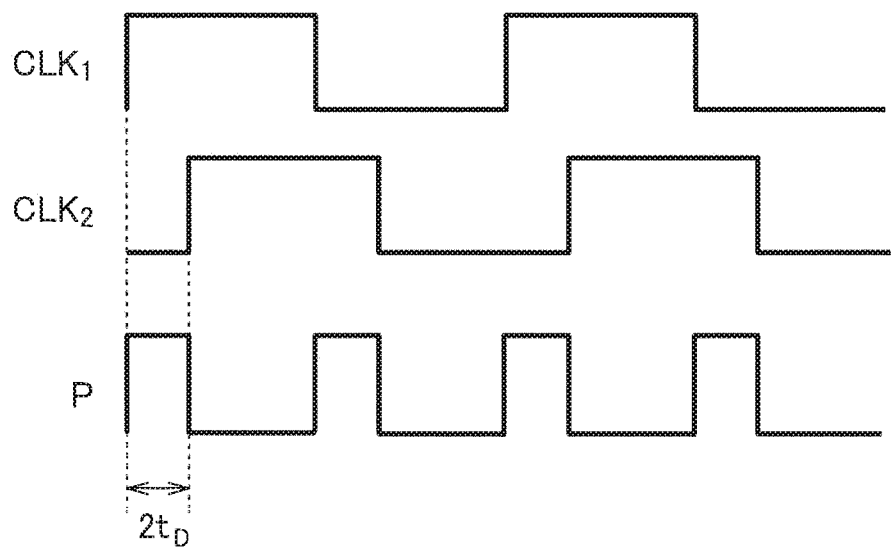
FIG. 15 is a diagram showing a pulse outputted by EXOR circuitry of FIG. 14.

FIG. 15 is a diagram showing the pulse P outputted by the EXOR circuitry of FIG. 14. As shown in FIG. 15, the EXOR circuitry of FIG. 15 outputs the pulse P having a pulse width of $2 t_D s$, which is a difference in delay amount between the first delay clock $CLK_1$ and second delay clock $CLK_2$, at predetermined time intervals.

As explained above, the generator circuitry according to the present embodiment can generate the pulse P having a predetermined pulse width by the pulse generator 5, based on a plurality of pulses generated within the delay circuitry 2. The pulse width of the pulse P is the difference in delay amount between the first delay clock $CLK_1$ and second delay clock $CLK_2$. This difference is fixed with high accuracy by the delay locked loop. Therefore, the pulse generator 5 can generate the pulse P having an accurate pulse width.

The pulse P generated in this way can be used in the analog circuitry supplied with the reference current $I_{REF}$ from the generator circuitry. Generally, in an analog circuitry, a high-accuracy pulse is useful. Further, using the generator circuitry according to the present embodiment eliminates the need to provide a pulse generator in the analog circuitry, which leads to the reduction in the circuitry area of the analog circuitry.

In the example of FIG. 14, the first delay clock $CLK_1$ is the clock CLK and the second delay clock $CLK_2$ is the clock outputted by the delay unit 22 in the second stage, but the first delay clock $CLK_1$ and second delay clock $CLK_2$ should not be limited thereto.

Further, the pulse generator 5 should not be limited to the EXOR circuitry, and can be formed using an arbitrary logic circuitry such as AND circuitry, OR circuitry, NAND circuitry, NOR circuitry, etc.

Fourth Embodiment

A pipeline ADC 100 according to a fourth embodiment will be explained referring to FIG. 16. The pipeline ADC 100 according to the present embodiment has the generator circuitry according to any one of the first to third embodiments. The pipeline ADC 100 performs AD conversion on an analog signal $ADC_{IN}$ inputted thereto, and outputs a digital signal $ADC_{OUT}$ depending on the analog signal $ADC_{IN}$.

Figure 16:
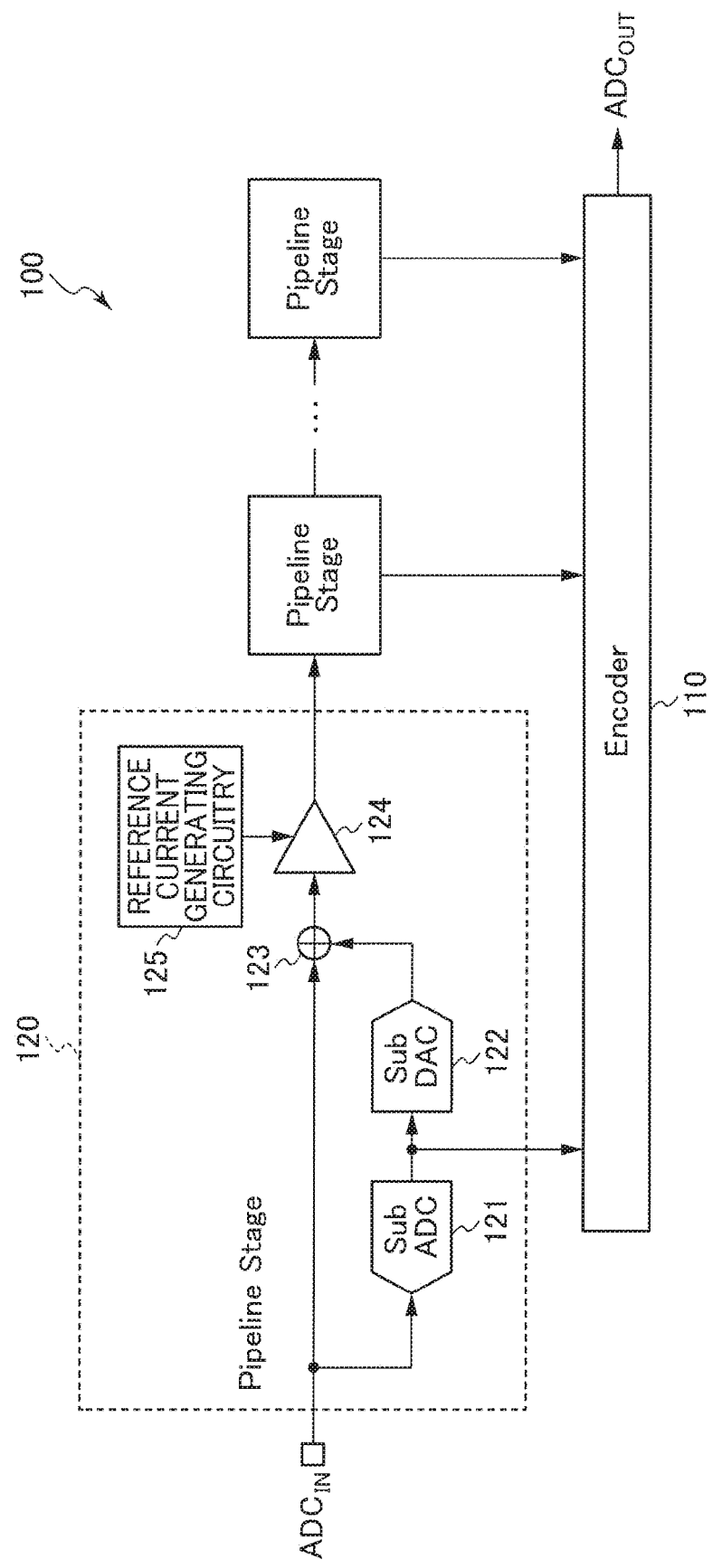
FIG. 16 is a diagram showing an example of a pipeline ADC according to a fourth embodiment.

FIG. 16 is a diagram showing an example of the pipeline ADC 100 according to the present embodiment. As shown in FIG. 16, the pipeline ADC 100 has an encoder 110 and a plurality of pipeline stages 120.

The encoder 110 encodes the digital signal $ADC_{OUT}$ based on the result of A/D conversion performed by each pipeline stage 120.

Each pipeline stage 120 has a sub-ADC 121, a sub digital to analog converter (hereinafter referred to as "sub-DAC") 122, residual calculation circuitry 123, amplifier circuitry 124, and a generator circuitry 125.

The sub-ADC 121 is inputted with the analog signal $ADC_{IN}$ or the output signal of the pipeline stage 120 in the former stage, performs AD conversion on the inputted signal, and outputs a result of the A/D conversion. As the sub-ADC, an ADC such as a delta-sigma ADC, a flash ADC, and a successive approximation ADC can be arbitrarily used. The A/D conversion result outputted by the sub-ADC 121 is inputted into the sub-DAC 122 and encoder 110.

The sub-DAC 122 is inputted with the A/D conversion result from the sub-ADC 121, performs DA conversion on the inputted A/D conversion result, and outputs an analog signal. As the sub-DAC 122, a DAC such as a capacitive DAC and a resistive DAC can be arbitrarily used. The output signal of the sub-DAC 122 is inputted into the residual calculation circuitry 123.

The residual calculation circuitry 123 is inputted with the analog signal $ADC_{IN}$ or the output signal of the pipeline stage 120 in the former stage together with the output signal of the sub-DAC 122, and outputs a difference between these signals as a residual signal. As the residual calculation circuitry 123, an analog adder, an analog subtracter, etc. can be used. The residual signal outputted by the residual calculation circuitry 123 is inputted into the amplifier circuitry 124.

The amplifier circuitry 124 is inputted with the residual signal from the residual calculation circuitry 123 and amplifies the residual signal inputted thereto. The amplifier circuitry 125 inputs the amplified residual signal into the next pipeline stage 120.

The generator circuitry 125 is the generator circuitry according to any one of the first to third embodiments and supplies driving current to the amplifier circuitry 124. The generator circuitry 125 is inputted with the operation clock of the pipeline ADC as the clock CLK.

As explained above, the pipeline ADC 100 according to the present embodiment supplies driving current to the amplifier circuitry 124 by the generator circuitry 125 according to any one of the first to third embodiments. Such a configuration makes it possible to reduce the power consumption of the pipeline ADC 100 while keeping the accuracy of AD conversion performed by the pipeline ADC 100.

In the example of FIG. 16, each pipeline stage 120 has one generator circuitry 125, but only one generator circuitry 125 may be provided in the pipeline ADC 1. In this case, the reference current $I_{REF}$ outputted by the one generator circuitry 125 should be supplied to the amplifier circuitry 124 in each pipeline stage 120 through the current mirror circuitry.

Note that, in the present embodiment, the generator circuitry 125 according to any one of the first to third embodiments is applied to the pipeline ADC, but it can be applied to another kind of ADC such as a ΔΣADC, a successive approximation ADC, a flash ADC, and a subrange ADC.

Fifth Embodiment

A wireless communication device 200 according to a fifth embodiment will be explained referring to FIG. 17. The wireless communication device 200 according to the present embodiment has the generator circuitry according to any one of the first to third embodiments.

Figure 17:
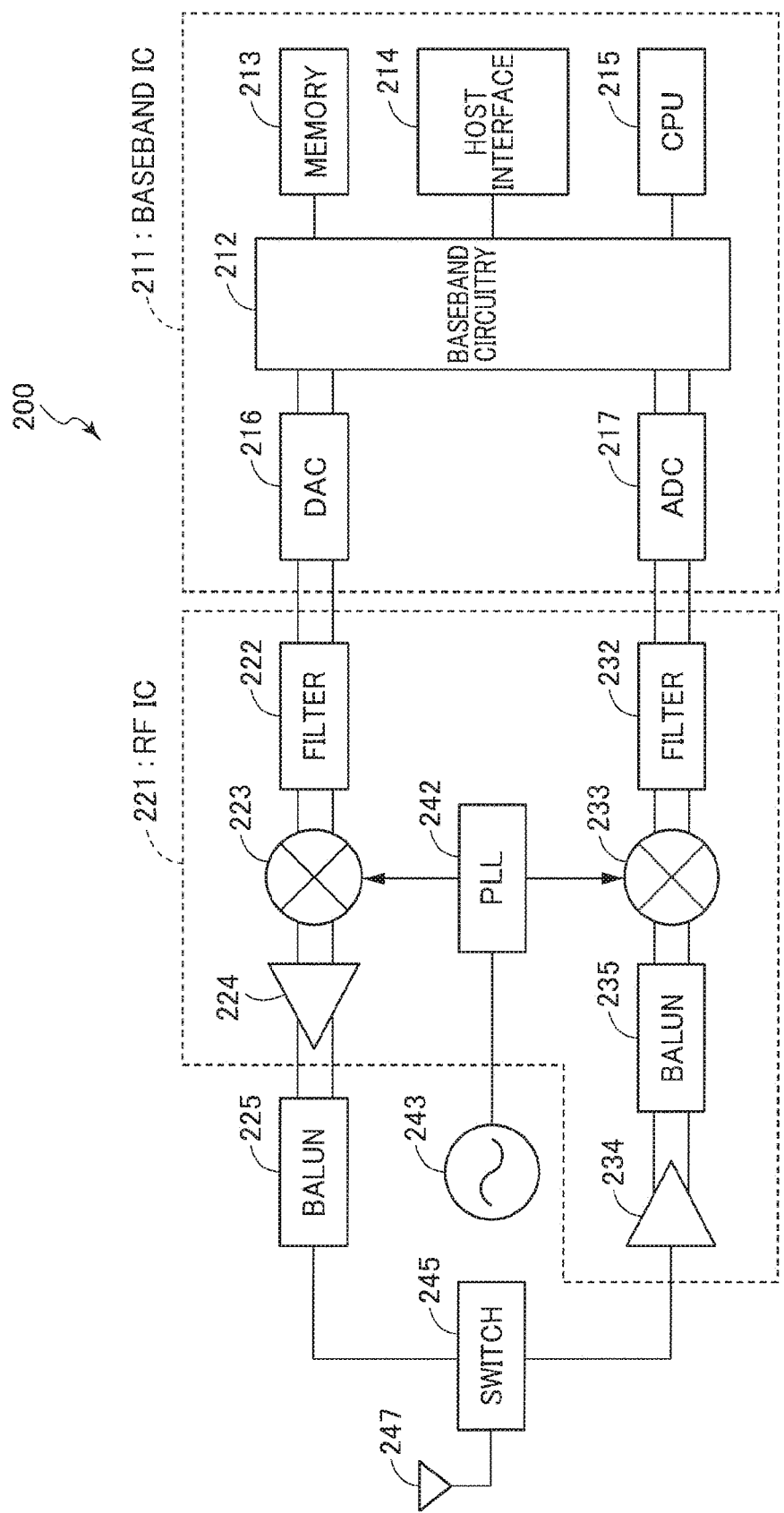
FIG. 17 is a diagram showing an example of a hardware configuration of a wireless communication device according to a fifth embodiment.

FIG. 17 is a diagram showing an example of a hardware configuration of the wireless communication device according to the present embodiment. This configuration can be applied both when a wireless terminal having the wireless communication device 200 serves as an access point and when it does not serve as an access point.

As shown in FIG. 17, this wireless communication device 200 has a baseband IC (Integrated Circuitry) 211, an RF (Radio Frequency) IC 221, a balun 225, a crystal oscillator 243, a switch 245, and an antenna 247.

The baseband IC 211 has baseband circuitry 212, a memory 213, a host interface 214, a CPU (Central Processing Unit) 215, a DAC 216, and an ADC 217.

The memory 213 stores data exchanged between the wireless communication device 200 and a host system. The memory 213 further stores information notified to another wireless communication device and information notified by another wireless communication device, for example. Further, the memory 213 stores a program required to run the CPU 215, and is used as a work area for the CPU 215 to execute the program. The memory 213 may be a volatile memory such as an SRAM and a DRAM, or may be a nonvolatile memory such as a NAND and an MRAM.

The host interface 214 is an interface for connecting the wireless communication device 200 to the host system. The interface is, e.g., UART, SPI, SDIO, USB, or PCI Express, but should not be limited thereto.

The CPU 215 is a processor for controlling the baseband circuitry 212 by executing a program. The baseband circuitry 212 mainly performs a process in the MAC layer and a process in the physical layer. At least one of the baseband circuitry 212 and CPU 215 functions as a communication control device for controlling communication.

Further, at least one of the baseband circuitry 212 and CPU 215 may include a clock generator for generating a clock in order to manage the internal time of the communication device 200 by the clock generated by this clock generator.

As a process in the physical layer, the frame to be transmitted is added with a physical header, encoded, encrypted, and modulated (MIMO modulation may be used) by the baseband circuitry 212 to generate e.g. two types of digital baseband signals (hereinafter referred to as a digital I (In-phase) signal and a digital Q (Quad-phase) signal). Here, the frame may include what is called a packet under the IEEE 802.11 standards or the standards based thereon, such as a Null Data Packet. Note that when transmitting a signal from a single system without performing orthogonal modulation, the baseband circuitry 212 should generate one type of baseband signal.

The DAC 216 performs DA conversion on the signal inputted from the baseband circuitry 212. More specifically, the DAC 216 converts the digital I signal into an analog I signal, and converts the digital Q signal into an analog Q signal. When the wireless communication device 200 has a plurality of antennas and transmits transmission signals from one or more systems allocating them to the antennas, the number of DACs 216 to be provided may depend on the number of antennas.

The ADC 217 of the baseband IC 211 will be mentioned later.

The RF IC 221 is at least one of an RF analog IC and a high frequency IC, for example. The RF IC 221 has a filter 222, a mixer 223, a preamplifier 224, a PLL 242, an LNA (Low Noise Amplifier) 234, a balun 235, a mixer 233, and a filter 232. Some of the above components of the RF IC 221 may be arranged on the baseband IC 211 or on another IC.

The filter 222 extracts a signal in a desired band from each of the analog I signal and analog Q signal inputted from the DAC 216. The filter 222 may be a band pass filter, or may be a low-pass filter.

The PLL 242 at least divides or multiplies the oscillation signal using the oscillation signal inputted from the crystal oscillator 243, to generate a constant frequency signal synchronizing with the phase of the input signal. The PLL 242 has a VCO (Voltage Controlled Oscillator) for example. The PLL 242 can generate the constant frequency signal by performing feedback control using the VCO based on the oscillation signal inputted from the crystal oscillator 243. The constant frequency signal thus generated is inputted into the mixers 223 and 233. The wireless communication device 200 may have another circuitry capable of generating the constant frequency signal, instead of the PLL 242.

The mixer 223 up-converts the analog I signal and analog Q signal after passing through the filter 222 into radio frequencies by using the constant frequency signal supplied from the PLL 242.

The preamplifier 224 amplifies the analog I signal and analog Q signal at the radio frequencies generated by the mixer 223 to desired output power.

The balun 225 is a converter for converting balanced signals (differential signals) into an unbalanced signal (single-ended signal). The balanced signals used by the RF IC 221 should be handled as an unbalanced signal after those are outputted from the RF IC 221 and until those are transmitted to the antenna 247, and thus the balun 225 performs the above signal conversion.

In the case of transmission, the switch 245 is connected to the balun 225 on the transmitting side, and in the case of reception, the switch 245 is connected to the LNA 234 on the receiving side. The switch 245 may be controlled by the baseband IC 211, by the RF IC 221, or by another circuitry provided to control the switch 245.

The analog I signal and analog Q signal at radio frequencies amplified by the preamplifier 224 undergo balance-unbalance conversion performed by the balun 225, to be emitted into the space from the antenna 247 as radio waves.

The antenna 247 may be a chip antenna, may be an antenna formed using wiring on a printed board, or may be an antenna formed using a linear conductive element.

The LNA 234 receives a signal from the antenna 247 through the switch 245, and amplifies the signal to a demodulable level while keeping noise low.

The balun 235 performs unbalance-balance conversion on the signal amplified by the LNA 234.

The mixer 233 down-converts the received signal converted into balanced signals by the balun 235 into baseband signals by using a constant frequency signal inputted from the PLL 242. More specifically, the mixer 233 generates carrier waves having phases shifted from each other by 90°, based on the constant frequency signal inputted from the PLL 242. Then, the mixer 233 performs orthogonal demodulation on the received signals converted by the balun 235 by using carrier waves having phases shifted from each other by 90°, to generate an I signal having the same phase as the received signal and a Q signal having a phase delayed from the I signal by 90°. Note that the mixer 233 may generate only a single system signal without performing the orthogonal demodulation.

The filter 232 extracts a signal in a desired band from each of the I signal and Q signal generated by the mixer 233. The filter 232 may be a band pass filter, or may be a low-pass filter.

The I signal and Q signal extracted by the filter 232 are subjected to gain adjustment and outputted from the RF IC 221.

The ADC 217 of the baseband IC 211 performs AD conversion on the signals inputted from the RF IC 221. More specifically, the ADC 217 converts the I signal into the digital I signal, and converts the Q signal into the digital Q signal.

In the present embodiment, as the ADC 217, ADC having the generator circuitry according to any one of the first to third embodiments is used. The ADC 217 may be the pipeline ADC according to the fourth embodiment, or may be another type of ADC. The digital I signal and digital Q signal outputted by the ADC 217 are inputted into the baseband circuitry 212.

The baseband circuitry 212 obtains a frame by performing a process in the physical layer such as demodulation (including MIMO demodulation), error correction code processing, and physical header processing, based on the digital I signal and digital Q signal inputted from the ADC 217. The baseband circuitry 212 performs a process in the MAC layer on the frame. When the baseband circuitry 212 supports TCP/IP, it may perform a TCP/IP process.

Note that, in the example of FIG. 17, the wireless communication device 200 has one antenna 247, but it may have a plurality of antennas. In this case, the wireless communication device 200 may have a set consisting of the transmission system (216 and 222 to 225), reception system (232 to 235), PLL 242, crystal oscillator 243, and switch 245 with respect to each antenna 247. Each set may be connected to the baseband circuitry 212.

Further, the baseband IC 211 and RF IC 221 may be formed on the same substrate. Furthermore, the baseband IC 211 and RF IC 221 may be formed in one chip. Both or any one of the DAC 216 and ADC 217 may be arranged in the RF IC 221, or may be arranged in another IC. Further, both or any one of the memory 213 and CPU 215 may be arranged in an IC separated from the baseband IC.

As explained above, the wireless communication device 200 according to the present embodiment has the ADC 217 having the generator circuitry according to any one of the first to third embodiments. Such a configuration makes it possible to reduce the power consumption of the wireless communication device 200 while keeping the communication accuracy of the wireless communication device 200.

Sixth Embodiment

A wireless terminal according to a sixth embodiment will be explained referring to FIGS. 18 to 20. The wireless terminal according to the present embodiment has the wireless communication device according to the fifth embodiment. Each of FIGS. 18 to 20 is a perspective diagram showing an example of the wireless terminal according to the present embodiment.

Figure 18:
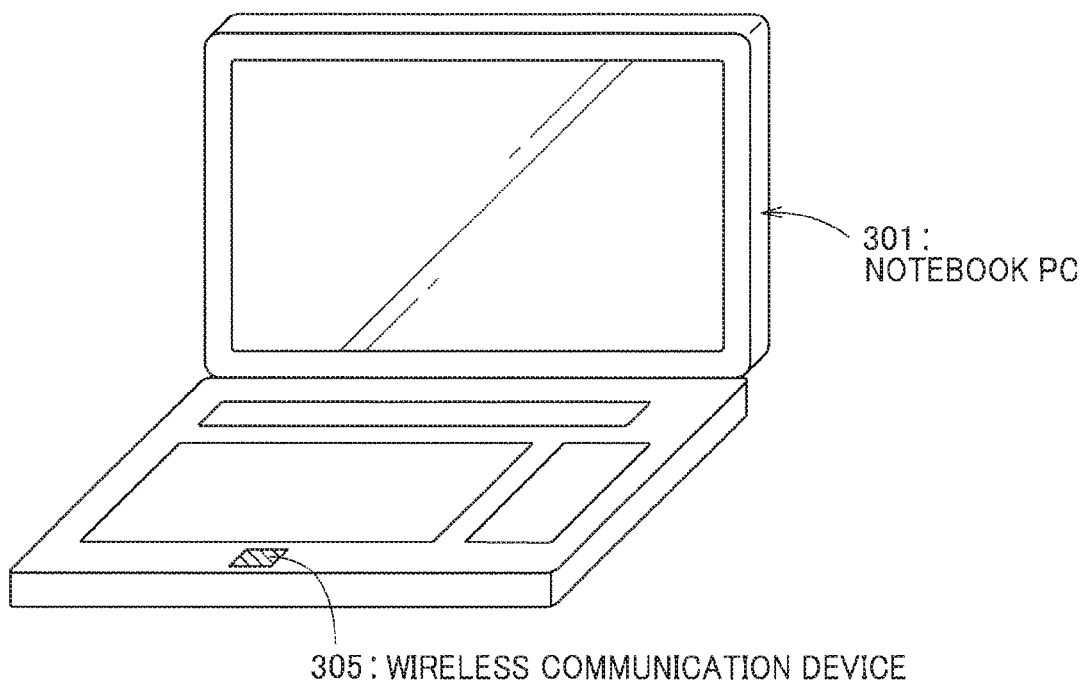
FIG. 18 is a perspective diagram showing an example of a wireless terminal according to a sixth embodiment.
Figure 19:
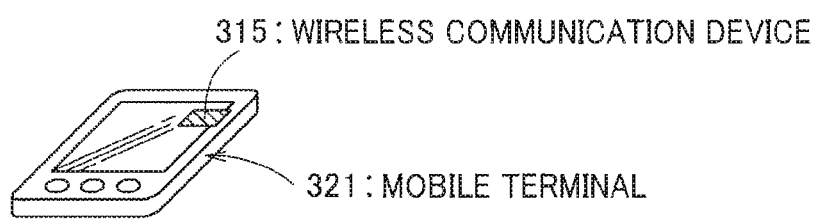
FIG. 19 is a perspective diagram showing another example of the wireless terminal according to the sixth embodiment.
Figure 20:
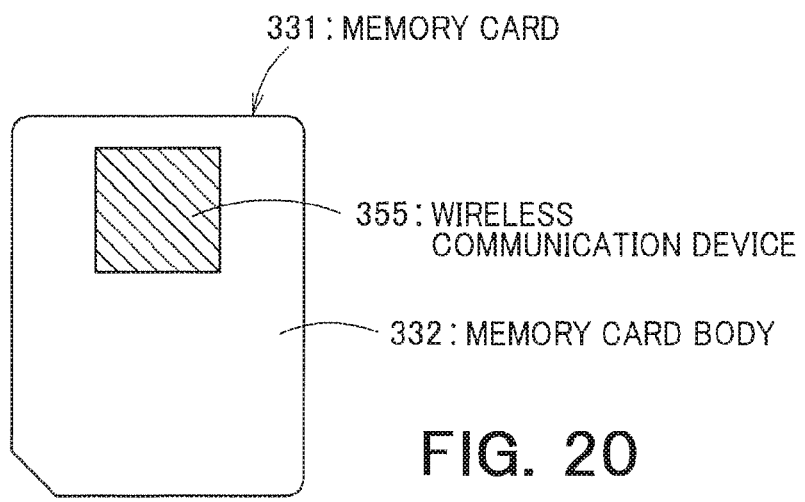
FIG. 20 is a perspective diagram showing further another example of the wireless terminal according to the sixth embodiment.

The wireless terminal of FIG. 18 is a notebook PC 301, and the wireless terminal of FIG. 19 is a mobile wireless terminal 321. The notebook PC 301 and mobile wireless terminal 321 have wireless communication devices 305 and 315, respectively. Each of the wireless communication devices 305 and 315 is the wireless communication device according to the fifth embodiment.

Note that the radio communication terminal having the wireless communication device should not be limited to the notebook PC and mobile wireless terminal. The wireless communication device may be mounted on, e.g., TV, digital camera, wearable device, tablet, smartphone, game device, network storage device, monitor, digital audio player, Web camera, video camera, project, navigation system, external adapter, internal adapter, set-top box, gateway, printer server, mobile access point, router, enterprise/service provider access point, portable device, handheld device, etc.

Further, the wireless communication device according to the fifth embodiment can be mounted on a memory card. FIG. 20 is a diagram showing an example of the memory card. A memory card 331 of FIG. 20 includes a wireless communication device 355 according to the fifth embodiment and a memory card body 332. The memory card 331 uses the wireless communication device 335 to wirelessly communicate with an external device (another wireless terminal, access point, etc.) Note that the other elements (such as a memory) in the memory card 331 are omitted from FIG. 20.

While certain embodiments have been described, these embodiments have been presented by way of example only, and are not intended to limit the scope of the disclosures. Indeed, the novel methods and systems described herein may be embodied in a variety of other forms; furthermore, various omissions, substitutions and changes in the form of the methods and systems described herein may be made without departing from the spirit of the disclosures. The accompanying claims and their equivalents are intended to cover such forms or modifications as would fall within the scope and spirit of the disclosures.

The invention claimed is:

1. A reference current generating circuit comprising:
a variable current supply to output a reference current;

delay circuitry to generate a reference clock by delaying a clock by a reference delay amount and a delay clock by delaying the clock depending on a current value of the reference current;

a phase comparator to compare a phase of the reference clock with a phase of the delay clock to output a comparison result; and control circuitry to control the current value of the reference current based on the compared result, wherein the control circuitry performs control so that a delay amount of the delay clock approaches the reference delay amount.

2. The reference current generating circuitry of claim 1, wherein the delay circuitry comprises at least one delay unit to delay the clock depending on the current value of the reference current.

3. The reference current generating circuitry of claim 1, wherein the reference delay amount is set depending on a cycle of the clock.

4. The reference current generating circuitry of claim 1, wherein the clock is an operation clock of a discrete time signal processing circuitry.

5. The reference current generating circuitry of claim 1, further comprising a pulse generator to generate a pulse based on a first delay clock and a second delay clock generated by the delay circuitry.

6. The reference current generating circuitry of claim 5, wherein the pulse has a pulse width depending on a difference between a delay amount of the first delay clock and a delay amount of the second delay clock.

7. The reference current generating circuitry of claim 5, wherein the pulse has a pulse width depending on a difference between a delay amount of the first delay clock and a delay amount of the second delay clock.

8. The reference current generating circuitry of claim 1, further comprising a phase-locked loop to generate the clock by multiplying or dividing an operation clock of a discrete time signal processing circuitry.

9. An A/D converter comprising:
reference current generating circuitry; and
an operational amplifier to be supplied with the reference current generated by the reference current generating circuitry, as a driving current,
the reference current generating circuitry comprising:
a variable current source to output a reference current;
delay circuitry to generate a reference clock by delaying a clock by a reference delay amount and a delay clock by delaying the clock depending on a current value of the reference current;
a phase comparator to compare a phase of the reference clock with a phase of the delay clock to output a comparison result; and
control circuitry to control the current value of the reference current based on the compared result,
wherein the control circuitry performs control so that a delay amount of the delay clock approaches the reference delay amount.

10. The A/D converter of claim 9, wherein the delay circuitry comprises at least one delay unit to delay the clock depending on the current value of the reference current.

11. The A/D converter of claim 9, wherein the reference delay amount is set depending on a cycle of the clock.

12. The A/D converter of claim 9, wherein the clock is an operation clock of a discrete time signal processing circuitry.

13. The A/D converter of claim 9, further comprising a pulse generator to generate a pulse based on a first delay clock and a second delay clock generated by the delay circuitry.

14. The A/D converter of claim 9, further comprising a phase-locked loop to generate the clock by multiplying or dividing an operation clock of a discrete time signal processing circuitry.

15. A wireless communication device comprising an A/D converter, the A/D converter comprising:
reference current generating circuitry; and
an operational amplifier to be supplied with the reference current generated by the reference current generating circuitry, as a driving current,
the reference current generating circuitry having:
a variable current supply to output a reference current;
delay circuitry to generate a reference clock by delaying a clock by a reference delay amount and a delay clock by delaying the clock depending on a current value of the reference current;
a phase comparator to compare a phase of the reference clock with a phase of the delay clock to output a comparison result; and
a control circuitry to control the current value of the reference current based on the comparison result,
wherein the control circuitry performs control so that a delay amount of the delay clock approaches the reference delay amount.

16. The wireless communication device of claim 15, wherein the delay circuitry comprises at least one delay unit to delay the clock depending on the current value of the reference current.

17. The wireless communication device of claim 15, wherein the reference delay amount is set depending on a cycle of the clock.

* * * * *